United States Patent
Su et al.

(10) Patent No.: US 9,525,024 B2
(45) Date of Patent: Dec. 20, 2016

(54) METHODS FOR INTRODUCING CARBON TO A SEMICONDUCTOR STRUCTURE AND STRUCTURES FORMED THEREBY

(71) Applicant: Taiwan Semiconductor Manufacturing Company, Ltd., Hsin-Chu (TW)

(72) Inventors: Yu-Chen Su, Hualien (TW);
Huang-Ming Chen, Hsin-Chu (TW);
Chun-Feng Nieh, Hsin-Chu (TW);
Pei-Chao Su, Zhudong Town (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/804,892

(22) Filed: Jul. 21, 2015

(65) Prior Publication Data

US 2015/0325644 A1    Nov. 12, 2015

Related U.S. Application Data

(62) Division of application No. 13/548,783, filed on Jul. 13, 2012, now Pat. No. 9,105,570.

(51) Int. Cl.
*H01L 29/06* (2006.01)
*H01L 27/092* (2006.01)
(Continued)

(52) U.S. Cl.
CPC ......... *H01L 29/0638* (2013.01); *H01L 21/225* (2013.01); *H01L 21/26586* (2013.01);
(Continued)

(58) Field of Classification Search
CPC .................. C23C 16/26; H01L 29/7831; H01L 21/76825; H01L 21/31155; H01L 21/3115; H01L 21/31; H01L 21/3105; H01L 21/76829
See application file for complete search history.

(56) References Cited

U.S. PATENT DOCUMENTS 6,323,519 B1   11/2001   Gardner et al.
6,730,570 B2   5/2004    Shin et al.
(Continued)

FOREIGN PATENT DOCUMENTS

CN   101790778   7/2010
CN   102044424   5/2011
(Continued)

OTHER PUBLICATIONS

U.S. Appl. No. 13/222,502, filed Feb. 28, 2013.
(Continued)

*Primary Examiner* — Jerome Jackson, Jr.
(74) *Attorney, Agent, or Firm* — Slater Matsil, LLP

(57) ABSTRACT

An embodiment is a method comprising diffusing carbon through a surface of a substrate, implanting carbon through the surface of the substrate, and annealing the substrate after the diffusing the carbon and implanting the carbon through the surface of the substrate. The substrate comprises a first gate, a gate spacer, an etch stop layer, and an inter-layer dielectric. The first gate is over a semiconductor substrate. The gate spacer is along a sidewall of the first gate. The etch stop layer is on a surface of the gate spacer and over a surface of the semiconductor substrate. The inter-layer dielectric is over the etch stop layer. The surface of the substrate comprises a surface of the inter-layer dielectric.

20 Claims, 5 Drawing Sheets

(51) Int. Cl.
*H01L 21/225* (2006.01)
*H01L 21/265* (2006.01)
*H01L 29/66* (2006.01)
*H01L 29/78* (2006.01)
*H01L 21/3115* (2006.01)
*H01L 21/768* (2006.01)
*H01L 29/51* (2006.01)
*H01L 29/165* (2006.01)

(52) U.S. Cl.
CPC .. *H01L 21/31155* (2013.01); *H01L 21/76825* (2013.01); *H01L 21/76826* (2013.01); *H01L 21/76828* (2013.01); *H01L 21/76834* (2013.01); *H01L 21/76897* (2013.01); *H01L 27/092* (2013.01); *H01L 29/66545* (2013.01); *H01L 29/66606* (2013.01); *H01L 29/66636* (2013.01); *H01L 29/7833* (2013.01); *H01L 29/7834* (2013.01); *H01L 29/165* (2013.01); *H01L 29/517* (2013.01)

(56) References Cited

U.S. PATENT DOCUMENTS

| | | |
|---|---|---|
| 7,087,515 B2 | 8/2006 | Ahn |
| 7,220,668 B2 | 5/2007 | Park |
| 7,348,283 B2 | 3/2008 | Leu et al. |
| 7,524,777 B2 * | 4/2009 | Kohli ............... H01L 21/3105 257/475 |
| 7,679,192 B2 | 3/2010 | Lee |
| 8,187,978 B2 * | 5/2012 | Warrick ............ H01L 21/31144 257/E21.257 |
| 8,304,819 B2 | 11/2012 | Jung |
| 8,431,453 B2 * | 4/2013 | Huang ................ H01L 27/088 257/369 |
| 8,492,217 B2 | 7/2013 | Frohberg et al. |
| 2004/0038517 A1 | 2/2004 | Kang et al. |
| 2004/0121590 A1 | 6/2004 | Moon et al. |
| 2005/0020093 A1 | 1/2005 | Ahn et al. |
| 2005/0026380 A1 | 2/2005 | Kammler et al. |
| 2005/0186722 A1 * | 8/2005 | Cheng ............... H01L 21/31155 438/199 |
| 2005/0230756 A1 * | 10/2005 | Chang ............ H01L 21/823807 257/351 |
| 2006/0138564 A1 | 6/2006 | Shin et al. |
| 2006/0141712 A1 | 6/2006 | Chun |
| 2006/0166494 A1 | 7/2006 | Lee |
| 2007/0042580 A1 | 2/2007 | Al-Bayati et al. |
| 2007/0141798 A1 | 6/2007 | Bohr |
| 2009/0134497 A1 | 5/2009 | Barth et al. |
| 2010/0181682 A1 * | 7/2010 | Arai .................. H01L 21/02126 257/774 |
| 2010/0330790 A1 * | 12/2010 | Hempel ........... H01L 21/31055 438/585 |
| 2011/0084320 A1 | 4/2011 | Jung |
| 2012/0202326 A1 | 8/2012 | Kronholz et al. |
| 2012/0248550 A1 | 10/2012 | Huang et al. |
| 2013/0049219 A1 | 2/2013 | Tsai et al. |
| 2013/0072016 A1 | 3/2013 | Frohberg et al. |
| 2013/0288468 A1 * | 10/2013 | Chi ..................... H01L 29/665 438/525 |

FOREIGN PATENT DOCUMENTS

| | | |
|---|---|---|
| KR | 20040026334 | 3/2004 |
| KR | 20060074127 | 7/2006 |
| KR | 20110023001 | 3/2011 |
| KR | 20110040470 | 4/2011 |

OTHER PUBLICATIONS

Office Action regarding Korean Patent Application No. 10-2011-0112996, dated Nov. 12, 2012, 18 pages.

Zhao, C., "A DRAM Compatible Cu Contact Using Self-Aligned Ta-silicide and Ta-barrier," Microelectronic Engineering 85 (2008), Elsevier B.V., pp. 2009-2012.

* cited by examiner

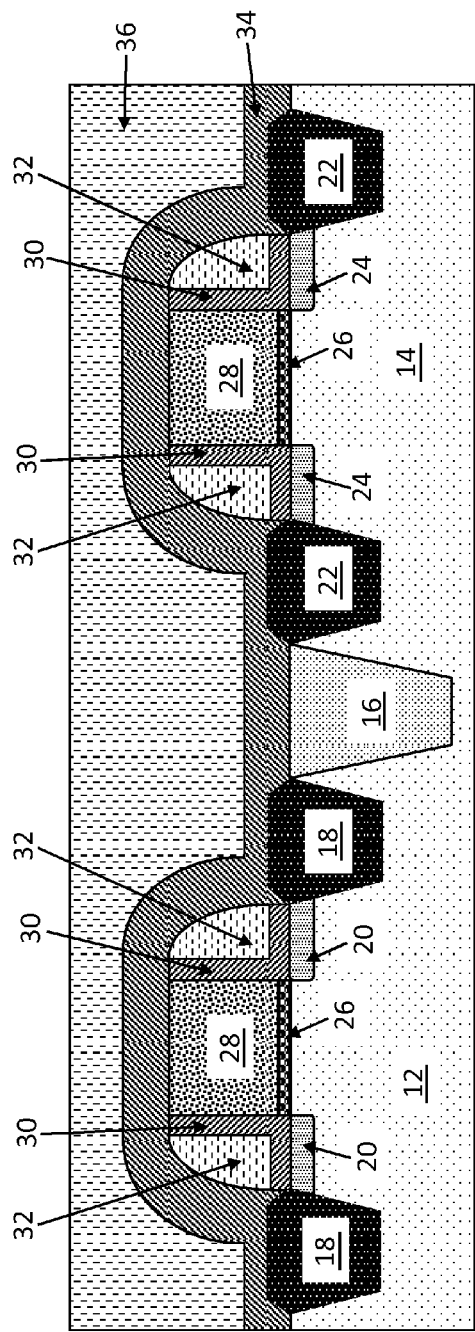
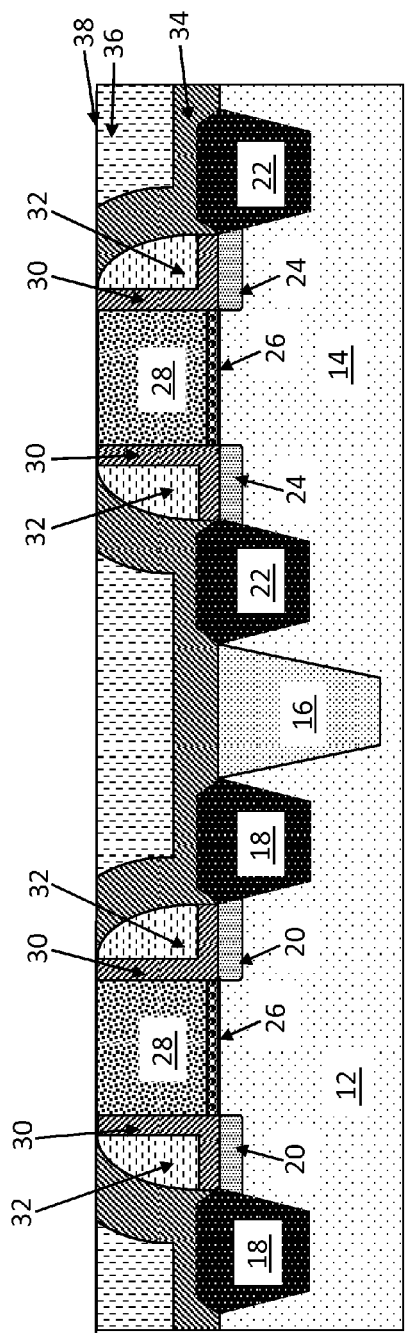
Fig. 1
Fig. 2

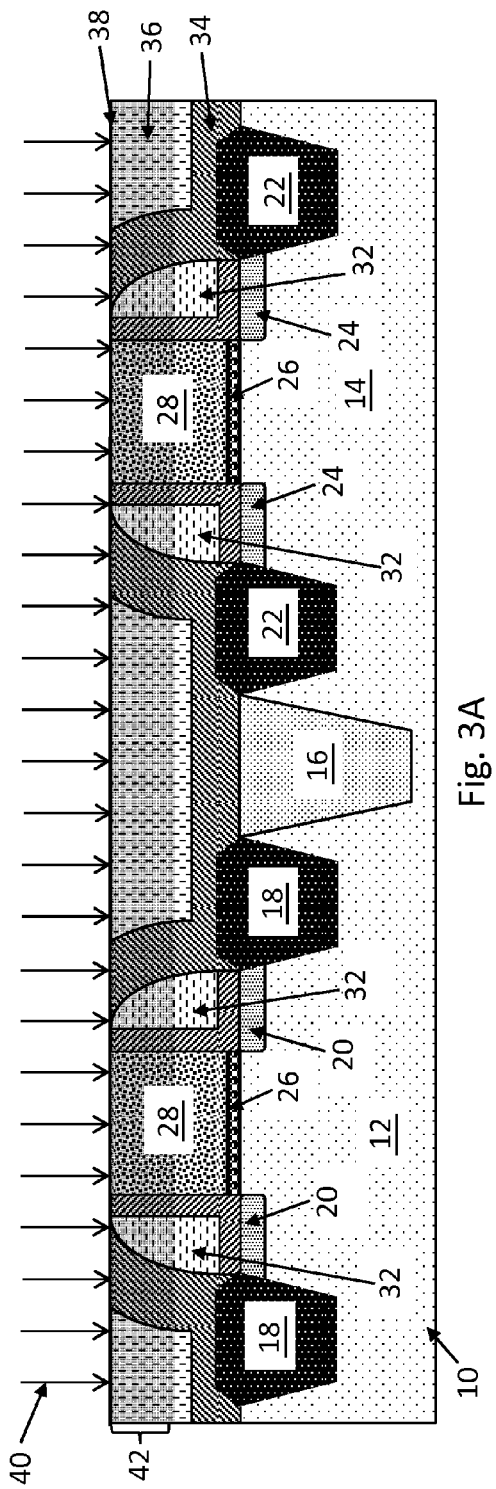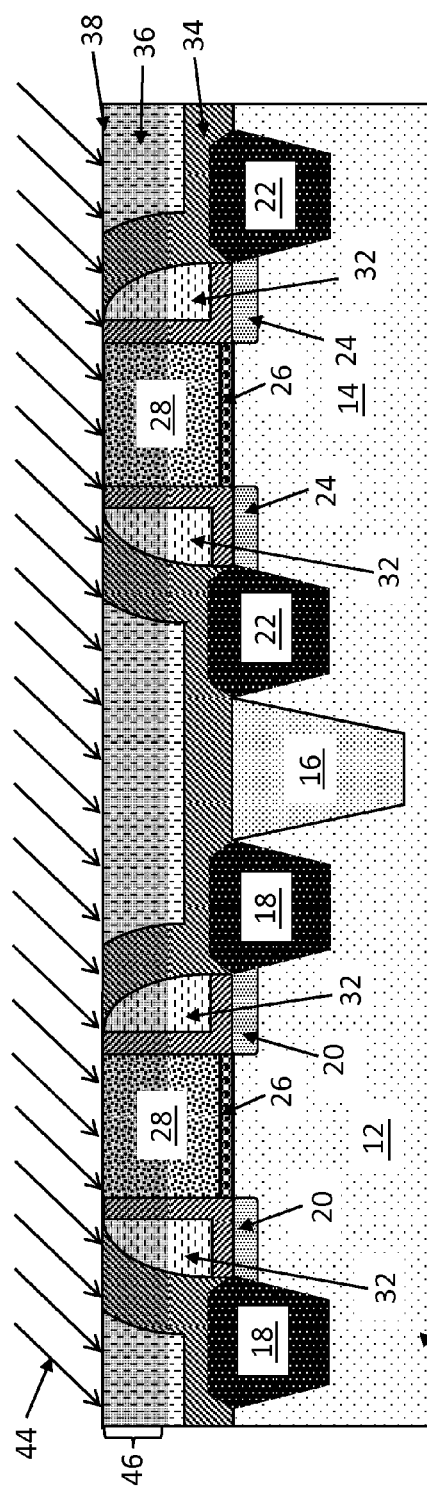

METHODS FOR INTRODUCING CARBON TO A SEMICONDUCTOR STRUCTURE AND STRUCTURES FORMED THEREBY

This application is a divisional of U.S. patent application Ser. No. 13/548,783, filed on Jul. 13, 2012, entitled "Methods for Introducing Carbon to a Semiconductor Structure," which application is hereby incorporated herein by reference in its entirety.

BACKGROUND

Since the development of the integrated circuit (IC), the semiconductor industry has sought to continue to improve the performance or size of the IC. Many of these improvements have focused on smaller feature sizes so that the speed of the IC can be increased. By decreasing the feature sizes, the density of devices (e.g., transistors, diodes, resistors, capacitors, etc.) on the IC has increased. By increasing the density, distances between devices generally decreases, which allows for a smaller resistance and capacitance between devices. Thus, a resistance-capacitance (RC) time constant can be decreased.

With the decrease in distances between devices generally comes more difficulty in ensuring proper alignment of features, such as contacts, in overlying layers with features in an underlying substrate, such as a source or drain. Tolerances can become very small in smaller technology nodes, and a small amount of misalignment of an overlying layer can cause overlay problems that can render devices faulty.

Further, features in devices that are intended to prevent faults in the case of misalignment can become thinner and weaker in smaller technology nodes. These thinner layers may not be able to withstand an etchant that is not selective to the layers. Even further, these features can be exposed to multiple etchants from various sides, particularly in the developing gate-last processes that are now being developed. The attacks on these features by the etchants can cause a subsequent unintended short circuit between conductive features, which can render devices useless.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 1, 2, 3A, 3B, 3C, and 4 through 8 are methods of forming a CMOS structure according to embodiments.

DETAILED DESCRIPTION OF ILLUSTRATIVE EMBODIMENTS

Figure 3C:
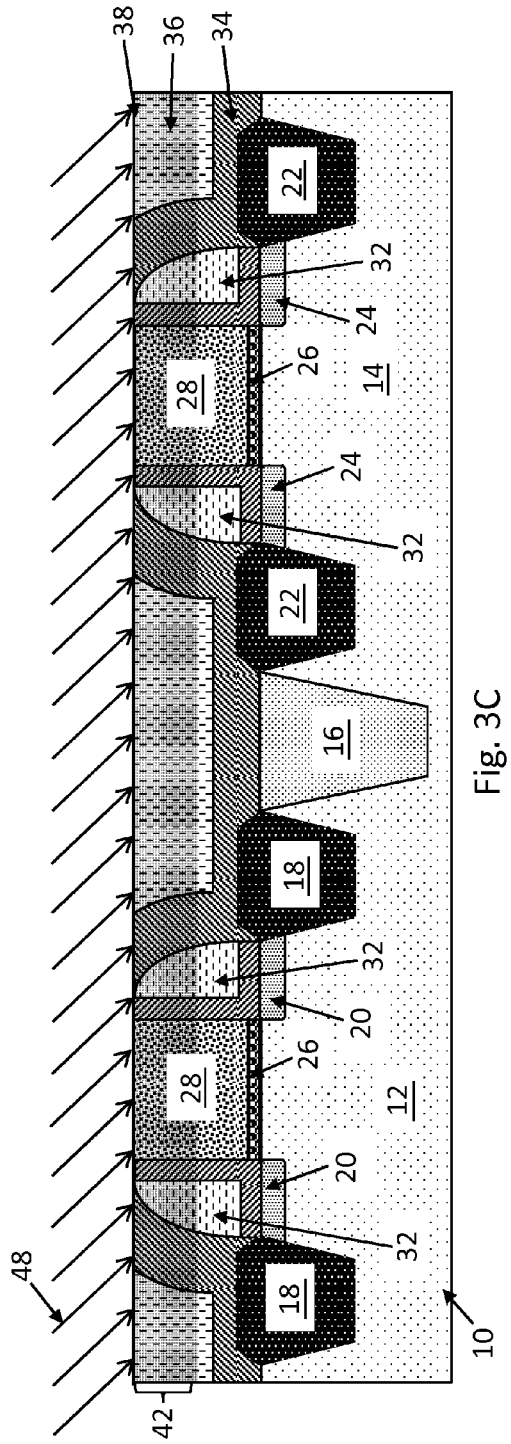

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a method to form a CMOS structure and the CMOS structure. The CMOS structure can include planar or fin field effect transistors. Further, a gate-last process is described herein, and other embodiments contemplate a gate-first process. The disclosed methods and structures are described in the context of a 20 nm technology node or smaller, and other embodiments contemplate different technology nodes. The methods disclosed herein are described in an example order. Other embodiments contemplate methods performed in any logical order. Like reference numerals in the figures refer to like components.

FIG. 1 illustrates an intermediate structure during processing according to an embodiment. The structure includes a substrate 10 having an n-type device region 12 ("n-region") and a p-type device region 14 ("p-region") separated by an isolation region 16. The substrate 10 is, for example, a bulk silicon substrate, a semiconductor on insulator (SOI) substrate, or another semiconductor substrate. The n-region 12 can be for a NMOS, n-type finFET, core NMOS or n-type finFET, or the like, and can include a p-type doped well. The p-region 14 can be for a PMOS, p-type finFET, core PMOS or p-type finFET, or the like, and can include an n-type doped well. The isolation region 16 can be a shallow trench isolation (STI), a field oxide, or the like.

Respective gate dielectrics 26 and dummy gates 28 are formed over the regions 12 and 14 of the substrate 10. To form these components, a dielectric layer is deposited over the substrate 10. The dielectric layer can be silicon oxide, silicon oxynitride, the like, or a combination thereof, formed by chemical vapor deposition (CVD), plasma-enhanced CVD (PECVD), the like, or a combination thereof. A dummy layer is deposited over the dielectric layer. The dummy layer in this embodiment is polysilicon, although other materials can be used, and can be deposited using CVD, atomic layer deposition (ALD), the like, or a combination thereof. A photoresist can then be deposited over the dummy layer, such as by spin-on deposition, and patterned by exposure to light. An etch can then remove portions of the dummy layer and dielectric layer that are not covered by the photoresist, thereby patterning the dummy gates 28 and the gate dielectrics 26. In an example embodiment, a top surface of the dummy gate 28 is a distance from a top surface of the substrate 10 in a direction normal to the top surface of the substrate, and the distance is approximately 450 Angstroms (Å). Other acceptable techniques for forming the gate dielectrics 26 and dummy gates 28 may also be used.

After the gate dielectrics 26 and dummy gates 28 are formed, n-type low-doped extension regions 20 in the n-region 12 and p-type low-doped extension regions 24 in the p-region 14 are formed. A first masking layer, such as a photoresist, can be patterned over the p-region 14, and n-type dopants, such as phosphorus, arsenic, the like, or a combination thereof, can be implanted into the n-region 12. The first masking layer is then removed. A second masking layer, such as a photoresist, can be patterned over the n-region 12, and p-type dopants, such as boron, the like, or a combination thereof, can be implanted into the p-region 14. Other acceptable techniques can be used for forming the low-doped extension regions 20 and 24.

Spacer liners 30 and spacers 32 are formed on sidewalls of the dummy gates 28 and gate dielectrics 26. A thin dielectric layer can be conformally deposited over the substrate 10 and dummy gates 28 and along sidewalls of the dummy gates 28 and gate dielectrics 26. The thin dielectric layer can be silicon nitride, silicon oxide, silicon oxynitride, the like or a combination thereof, formed by a CVD, the like, or a combination thereof. A spacer dielectric layer can be conformally deposited over the thin dielectric layer. The spacer dielectric layer can be silicon nitride, silicon oxide, silicon oxynitride, the like or a combination thereof, formed by a CVD, the like, or a combination thereof. An anisotropic etch can then pattern the dielectric layers into the spacer liners 30 and spacers 32 along the sidewalls. Other acceptable techniques can be used for forming the spacers 32 and spacer liners 30.

Source/drain regions 18 and 22 are formed in the n-region 12 and the p-region 14 of the substrate 10, respectively. In an embodiment, trenches are etched in the substrate 10 along edges of the spacers 32 and spacer liners 30 opposite the dummy gate 28. A first semiconductor material is epitaxially grown in the trenches in the n-region 12, and a second semiconductor material is epitaxially grown in the trenches in the p-region 14. These epitaxial semiconductor materials can be grown to a height above a top surface of the substrate 10 and may have facets between respective top surfaces of the epitaxial semiconductor materials and the top surface of the substrate 10. Example materials for the first semiconductor material in the n-region 12 include silicon phosphorus, silicon carbide, the like, or a combination thereof, formed by, for example, selective epitaxial growth (SEG) or the like. Example materials for the second semiconductor material in the p-region 14 include silicon germanium, the like, or a combination thereof, formed by, for example, SEG or the like. The epitaxial material materials in the n-region 12 and the p-region 14 may be doped with n-type dopants and p-type dopants, respectively, in situ during growth or after growth by an implant. Various masks may be used during etching, epitaxial growth, and/or doping. In another embodiment, the substrate 10 in the n-region 12 and the p-region 14 can be doped by an implant with n-type dopants and p-type dopants, respectively, to form the source/drain regions 18 and 22, respectively, without epitaxial materials. Other appropriate techniques can be used for forming the source/drain regions 18 and 22.

An etch stop layer (ESL) 34 is formed over the substrate 10, dummy gates 28, spacers 32, spacer liners 30, and source/drain regions 18 and 22. The ESL 34 is conformally deposited over components on the substrate 10. The ESL 34, in an embodiment, is silicon nitride, and may also be other like materials or a combination thereof. The ESL can be formed by CVD, the like, or a combination thereof.

An inter-layer dielectric (ILD) 36 is formed over the ESL 34. The ILD 36, in an embodiment, is silicon oxide, and may also be other like materials or a combination thereof. The ILD 36 can be formed by CVD, a high density plasma (HDP), the like, or a combination thereof.

In FIG. 2, the ILD 36 and ESL 34 are planarized to a top surface of the dummy gate 28 forming a planarized surface 38. In an embodiment, the ILD 36 and ESL 34 are planarized by using a chemical mechanical polish (CMP) to remove portions of the ILD 36 and ESL 34 to the planarized surface 38. In other embodiments, other planarization techniques may be used, such as including etching.

The planarized surface 38 is exposed to a carbon plasma. Example parameters of the carbon plasma include the following: pressure between about 1 mT and about 20 mT; power between about 100 W and about 300 W; frequency between about 2 MHz and about 13.6 MHz; time of exposure between about 30 seconds to about 300 seconds; and a pulse DC duty ratio between about 20% and about 80%. The carbon in the plasma reacts with the planarized surface 38. Carbon can diffuse from the planarized surface 38 to a depth below the planarized surface 38, such as in the ILD 36, ESL 34, the spacers 32, and/or spacer liners 30. As with a diffusion, a concentration of carbon can decrease from the planarized surface 38 to the depth. In an embodiment, a carbon concentration at the planarized surface 38 is between approximately $1 \times 10^{10}$ cm$^{-3}$ and approximately $1 \times 10^{17}$ cm$^{-3}$.

In FIG. 3A, carbon is implanted 40 to a depth below the planarized surface 38. The carbon is implanted 40 into, for example, the ILD 36, the ESL 34, the spacers 32, and/or spacer liners 30. The implantation 40 is at an angle that is normal to the planarized surface 38. The carbon can be implanted at a depth between approximately 150 Å and approximately 200 Å below the planarized surface 38. The implant can be at a depth between approximately one-third to one-half the distance of the top surface of the dummy gates 28 (e.g., the planarized surface 38) to the top surface of the substrate 10. The implant can use an energy between approximately 2 keV and approximately 10 keV. A concentration of the carbon at the depth below the planarized surface can be between approximately $1 \times 10^{14}$/cm$^3$ and approximately $1 \times 10^{15}$/cm$^3$. As with an implantation, a concentration of the implanted species can have a gradient as a function of depth, such as increasing to a depth where the concentration is greatest and then decreasing towards further depths.

After the plasma and implantation 40, the structure can have a substantially uniform concentration of carbon from the planarized surface 38 to the depth, although in other embodiments, the concentration varies over this distance. The decrease in carbon concentration due to the diffusion can be offset by an increase in carbon concentration due to the implantation as the distance from the planarized surface 38 increases. In other embodiments, the concentrations from the different steps are not offset, and the total concentration in the structure can vary as a function of distance from the planarized surface 38.

After the plasma and implantation 40, the structure is annealed resulting in a carbon-containing region 42. The anneal, such as a rapid thermal anneal, can be at a temperature between approximately 700° C. and approximately 1,300° C., such as approximately 1,000° C., for a duration between approximately 0.001 second and approximately 30 minutes. The anneal reacts the carbon with the materials of the ILD 36, the ESL 34, spacers 32, and spacer liners 30 in the carbon-containing region 42. In an embodiment where the ILD 36 is silicon oxide and each of the ESL 34, spacers 32, and spacer liners 30 is silicon nitride, the anneal results in silicon oxycarbide and silicon carbon nitride, respectively, in the carbon-containing region 42. It should be noted that portions of the ILD 36, ESL 34, spacers 32, and spacer liners 30 below the carbon-containing region 42 can have a lower concentration of carbon, such as substantially negligible, than portions of the ILD 36, ESL 34, spacers 32, and spacer liners 30 in the carbon-containing region 42. Hence, these lower portions can remain silicon oxide and silicon nitride, respectively, after the anneal.

FIGS. 3B and 3C are another example to implant carbon. In FIG. 3B, carbon is implanted 44 to a depth below the planarized surface 38 at a first tilt angle to form a first carbon implant region 46. The carbon is implanted 44 into, for example, the ILD 36, the ESL 34, the spacers 32, and/or spacer liners 30. The first tilt angle, in this example, is in a plane that is perpendicular to sidewalls of the dummy gates 28 and perpendicular to the planarized surface 38. The first tilt angle is in the plane and is between approximately 0° and approximately 90°, such as 45°, from an axis normal to the planarized surface 38 measured in a clockwise manner. The selection of a tilt angle can depend upon the pitch between the dummy gates 28 and the orientation of the dummy gates 28. The carbon can be implanted at a depth between approximately 150 Å and approximately 200 Å below the planarized surface 38. The implant can be at a depth between approximately one-third to one-half the distance of the top surface of the dummy gates 28 (e.g., the planarized surface 38) to the top surface of the substrate 10. The implant can use an energy between approximately 2 keV and approximately 10 keV.

In FIG. 3C, carbon is implanted 48 to a depth below the planarized surface 38 at a second tilt angle. The carbon is implanted 48 into, for example, the ILD 36, the ESL 34, the spacers 32, and/or spacer liners 30. The second tilt angle, in this example, is complementary to the first tilt angle and is in the plane that is perpendicular to sidewalls of the dummy gates 28 and perpendicular to the planarized surface 38. The second tilt angle is in the plane and is between approximately 0° and approximately 360°, such as 315°, from an axis normal to the planarized surface 38 measured in a clockwise manner (e.g., 45° from the axis measured in a counter-clockwise manner). The carbon can be implanted at a depth between approximately 150 Å and approximately 200 Å below the planarized surface 38. The implant can be at a depth between approximately one-third to one-half the distance of the top surface of the dummy gates 28 (e.g., the planarized surface 38) to the top surface of the substrate 10. The implant can use an energy between approximately 2 keV and approximately 10 keV. A concentration of the carbon at the depth below the planarized surface can be between approximately $1\times10^{14}/cm^3$ and approximately $1\times10^{15}/cm^3$. As with an implantation, a concentration of the implanted species can have a gradient as a function of depth.

After the plasma and implantations 44 and 48, the structure can have a substantially uniform concentration of carbon from the planarized surface 38 to the depth, although in other embodiments, the concentration varies over this distance. The decrease in carbon concentration due to the diffusion can be offset by an increase in carbon concentration due to the implantation as the distance from the planarized surface 38 increases. In other embodiments, the concentrations from the different steps are not offset, and the total concentration in the structure can vary as a function of distance from the planarized surface 38.

After the plasma and implantations 44 and 48, the structure is annealed resulting in a carbon-containing region 42. The anneal, such as a rapid thermal anneal, can be at a temperature between approximately 700° C. and approximately 1,300° C., such as approximately 1,000° C., for a duration between approximately 0.1 second and approximately 30 minutes. The anneal reacts the carbon with the materials of the ILD 36, the ESL 34, spacers 32, and spacer liners 30 in the carbon-containing region 42. In an embodiment where the ILD 36 is silicon oxide and each the ESL 34, spacers 32, and spacer liners 30 is silicon nitride, the anneal results in silicon oxycarbide and silicon carbon nitride, respectively, in the carbon-containing region 42. It should be noted that portions of the ILD 36, ESL 34, spacers 32, and spacer liners 30 below the carbon-containing region 42 can have a lower concentration of carbon, such as substantially negligible, than portions of the ILD 36, ESL 34, spacers 32, and spacer liners 30 in the carbon-containing region 42. Hence, these lower portions can remain silicon oxide and silicon nitride, respectively, after the anneal.

The introduction of carbon, such as by the plasma exposure and/or by implantation, to portions of the ESL 34, spacers 32, and spacer liners 30 and subsequent anneal can increase the density of each component. Thus, portions of the ILD 36, ESL 34, spacers 32, and spacer liners 30 below the carbon-containing region 42 can have a lower density than portions of the ILD 36, ESL 34, spacers 32, and spacer liners 30 in the carbon-containing region 42.

Figure 4:
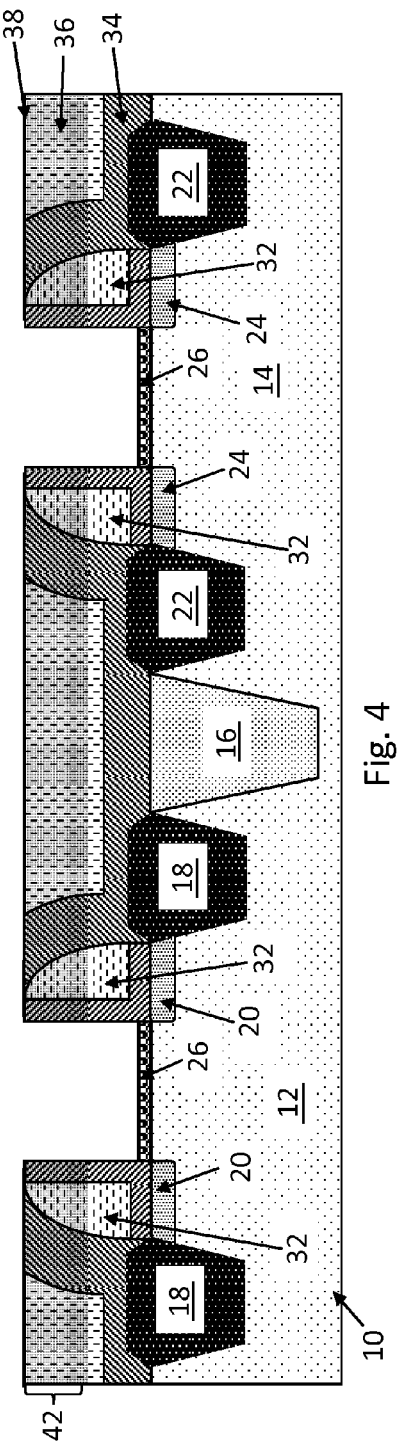

In FIG. 4, the dummy gates 28 are removed. The dummy gates 28 may be removed by an etch that is selective to the material of the dummy gates 28. It should be noted that different etchants may be used if carbon is also implanted into the dummy gates 28 such that portions of the dummy gates 28 contain carbon and others do not. For example, if the dummy gates 28 comprise polysilicon, top portions of the dummy gates 28 in the carbon-containing region 42 may be silicon carbide, and bottom portions are silicon. A first etch using, for example, $CF_4$ may remove the top portions, and a second etch using, for example, $NF_3$, $SF_6$, $Cl_2$, HBr, the like, or a combination thereof may remove the bottom portions.

Figure 5:
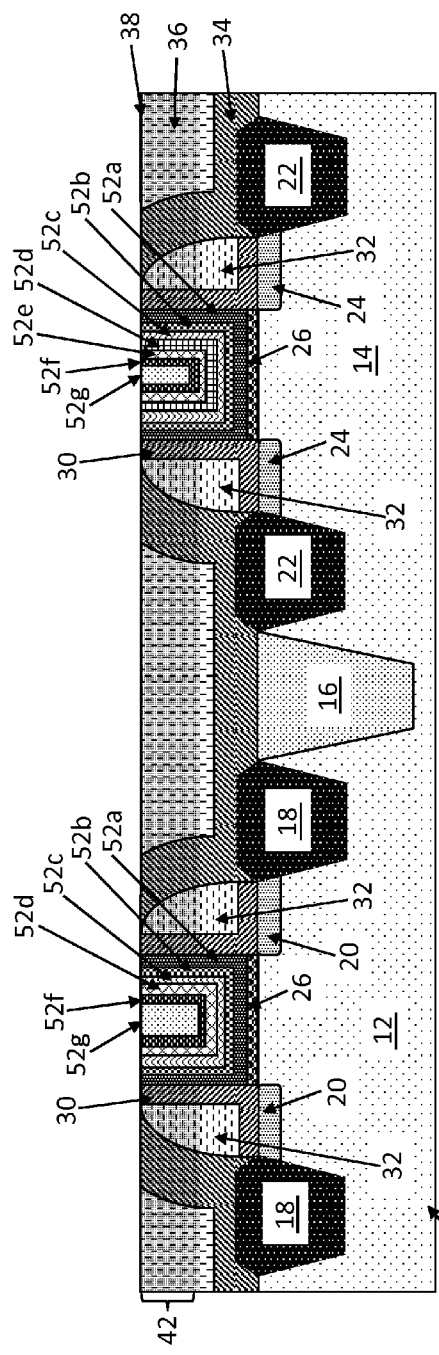

In FIG. 5, gate structures 52 are formed in the regions where the dummy gates 28 were removed. Various sub-layers 52a-52g can be included in the gate structures 52. Some of the sub-layers can each be a high-k dielectric layer, such as $HfSiO_4$, HfSiON, HfSiN, $ZrSiO4$, ZrSiON, ZrSiN, $ZrO_2$, $HfO_2$, $La_2O_3$, or the like. Other sub-layers over the high-k dielectric layers can be metal layers, such as tungsten, titanium nitride, or the like. The sub-layers 52a-52g are subsequently conformally deposited over the ILD 36 and in the region where the dummy gates 28 were removed, for example, using CVD, ALD, thermal deposition, or the like. A planarization, such as by CMP, removes excess materials of the layers over the planarized surface 38 to form the gate structures 52. In embodiments, some of sub-layers 52a-52g are not formed in both gate structures 52. For example, sub-layer 52e is not in the gate structure 52 over the n-region 12. This can be achieved by removing the sub-layer 52e using an etch, for example, while the gate structure 52 over the p-region 14 is masked. By having different sub-layers, different work functions of the devices may be achieved.

Figure 6:
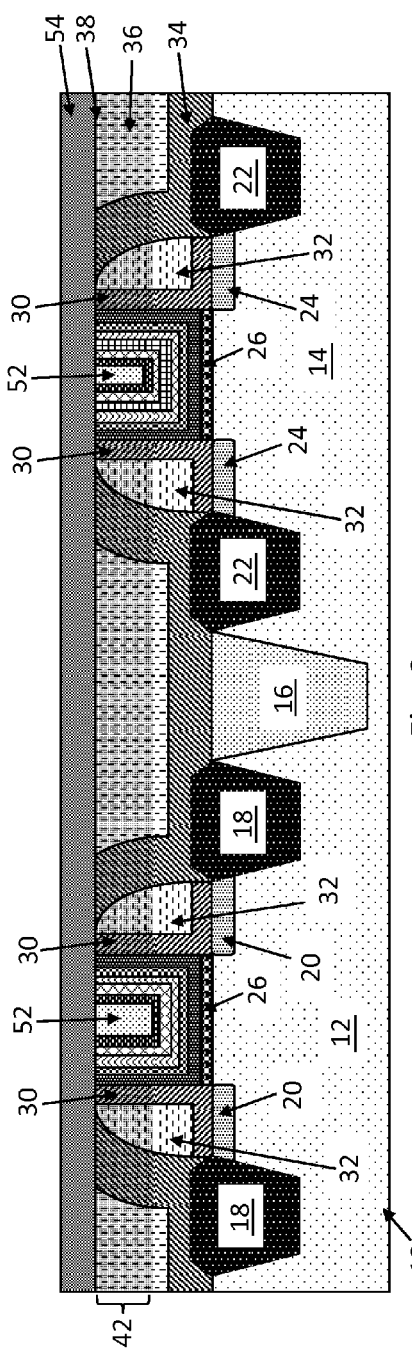
Figure 7:
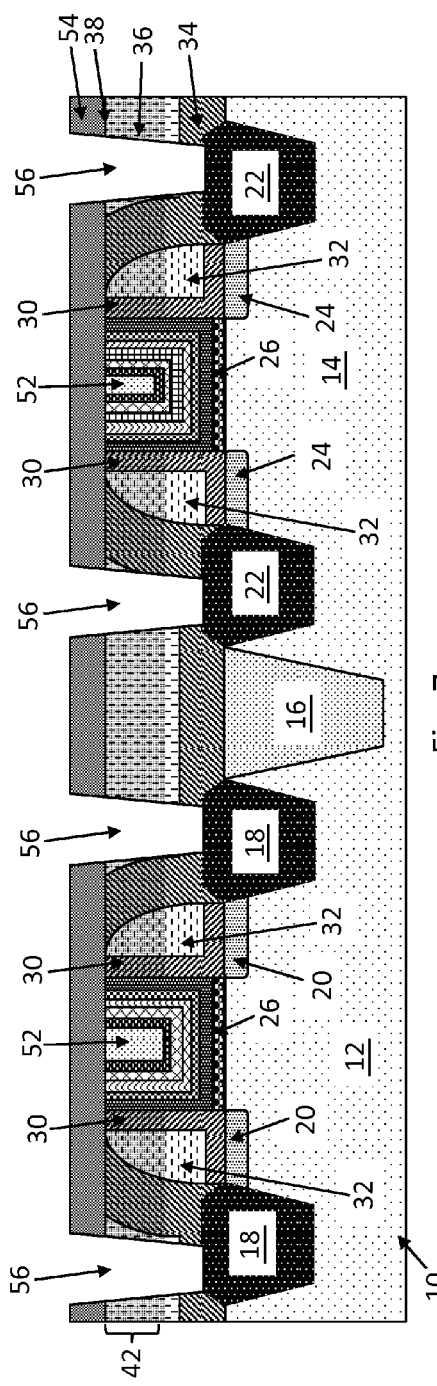
Figure 8:
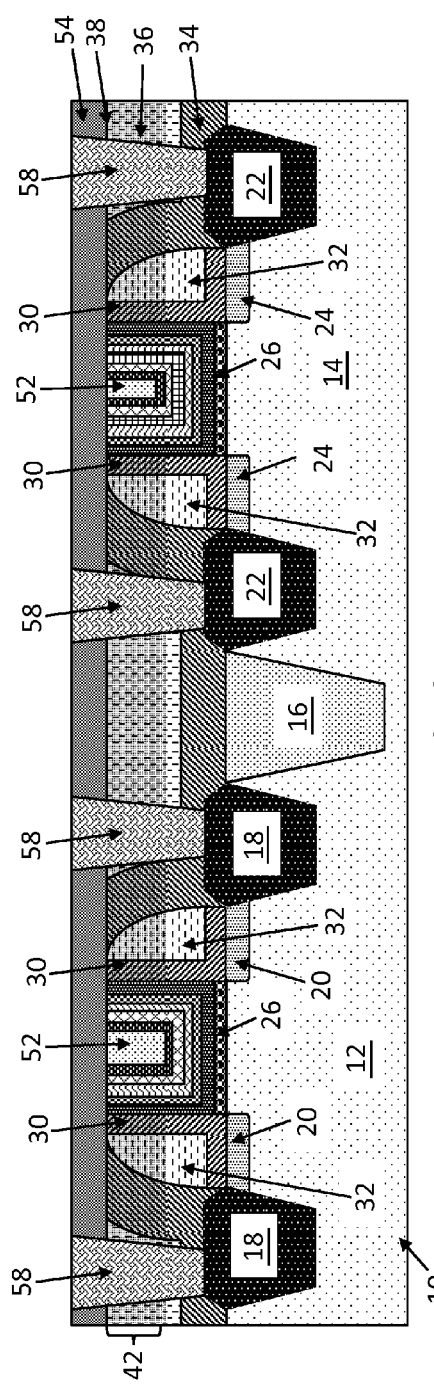

In FIG. 6, a CESL 54 is formed over the planarized surface 38. The CESL 54 can be a silicon nitride, silicon oxynitride, silicon carbide, silicon oxycarbide, the like, or a combination thereof, formed by a CVD, ALD, thermal deposition, the like, or a combination thereof. In FIG. 7, contact openings 56 are etched through the CESL 54, ILD 36, and CESL 34 to respective source/drain regions 18 and 22. A photoresist can be patterned over the CESL 54 and one or more etch steps can form the contact openings 56. In FIG. 8, contacts 58 are formed to respective source/drain regions 18 and 22 in the contact openings 56. A conductive material, such as a metal, can be deposited in the contact openings 56 and excess of the conductive material can be removed, such as by a CMP, to form the contacts 58. In other embodiments, another ILD can be formed over the CESL 54, and contact openings can be etched through the ILD, the CESL 54, ILD 36, and CESL 34 using respective etch steps. Contacts can be formed in the contact openings.

Embodiments may achieve a more robust spacer and etch stop layer to self-align contacts. The carbon plasma exposure and implant with subsequent anneal can make the spacers and etch stop layer denser, and the spacers and etch stop layer can thus have a slower etch rate than without carbon. The spacers and etch stop layer can be more robust against the etchant removing the dummy gates and the etchant etching the ILD to form a contact opening. Embodiments can achieve higher yield by preventing contact to metal gate leakage because of the more robust spacers and etch stop layer.

An embodiment is a method comprising diffusing carbon through a surface of a substrate, implanting carbon through the surface of the substrate, and annealing the substrate after the diffusing the carbon and implanting the carbon through the surface of the substrate. The substrate comprises a first gate, a gate spacer, an etch stop layer, and an inter-layer dielectric. The first gate is over a semiconductor substrate. The gate spacer is along a sidewall of the first gate. The etch stop layer is on a surface of the gate spacer and over a surface of the semiconductor substrate. The inter-layer dielectric is over the etch stop layer. The surface of the substrate comprises a surface of the inter-layer dielectric.

Another embodiment is a method comprising forming a first gradient of carbon in a direction from a surface of a substrate to a first depth in the substrate below the surface of the substrate; forming a second gradient of carbon in a direction from the surface of the substrate to a second depth in the substrate below the first depth; and after the forming the first gradient of carbon and the forming the second gradient of carbon, annealing the substrate. The forming the first gradient of carbon includes exposing the surface of the substrate to a carbon-containing plasma. The forming the second gradient of carbon includes implanting carbon through the surface of the substrate. The substrate comprises a gate spacer, an etch stop layer, and an inter-layer dielectric. The gate spacer is along a sidewall of a first gate, and the gate spacer is over a semiconductor substrate. The etch stop layer is along a surface of the gate spacer and over the semiconductor substrate. The inter-layer dielectric is over the etch stop layer.

A further embodiment is a structure comprising a gate over a semiconductor substrate, a gate spacer along a sidewall of the gate, an etch stop layer over the gate spacer and over the semiconductor substrate, and an inter-layer dielectric over the etch stop layer. A first portion of the gate spacer is distally located from the semiconductor substrate, and a second portion of the gate spacer is proximally located to the semiconductor substrate. The first portion has a higher concentration of carbon than the second portion. A third portion of the etch stop layer is distally located from the semiconductor substrate, and a fourth portion of the etch stop layer is proximally located to the semiconductor substrate. The third portion has a higher concentration of carbon than the fourth portion.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A structure comprising:
   a gate over a semiconductor substrate;
   a gate spacer along a sidewall of the gate, a first portion of the gate spacer being distally located from the semiconductor substrate, a second portion of the gate spacer being proximally located to the semiconductor substrate, the first portion having a higher concentration of carbon than the second portion;
   an etch stop layer over the gate spacer and over the semiconductor substrate, a third portion of the etch stop layer being distally located from the semiconductor substrate, a fourth portion of the etch stop layer being proximally located to the semiconductor substrate, the third portion having a higher concentration of carbon than the fourth portion; and
   an inter-layer dielectric over the etch stop layer.

2. The structure of claim 1, wherein a concentration of carbon in the first portion and the third portion is between $1\times10^{14}/cm^3$ and $1\times10^{15}/cm^3$.

3. The structure of claim 1, wherein the first portion and the third portion comprises silicon carbon nitride, and the second portion and the fourth portion comprises silicon nitride.

4. The structure of claim 1, wherein the first portion has a higher density than the second portion, and the third portion has a higher density than the fourth portion.

5. The structure of claim 1, wherein a surface of the etch stop layer, a surface of the inter-layer dielectric, and a surface of the gate are co-planar.

6. The structure of claim 1, wherein the inter-layer dielectric has a fifth portion distally located from the semiconductor substrate and a sixth portion proximally located to the semiconductor substrate, the fifth portion having a higher concentration of carbon than the sixth portion.

7. The structure of claim 1, wherein the etch stop layer, the inter-layer dielectric, or a combination thereof has a decreasing gradient of carbon in a direction from a top surface of the inter-layer dielectric.

8. A structure comprising:
   a semiconductor substrate;
   an etch-stop layer over the semiconductor substrate; and
   an inter-layer dielectric over the etch-stop layer, wherein a top surface of the inter-layer dielectric and a top surface of the etch-stop layer are co-planar, the etch-stop layer and the inter-layer dielectric including a first decreasing gradient of carbon in a direction from the top surface of the inter-layer dielectric that is co-planar with the top surface of the etch-stop layer.

9. The structure of claim 8 further comprising:
   a gate stack over the semiconductor substrate; and
   a gate spacer along a sidewall of the gate stack, the etch-stop layer extending along a surface of the gate spacer.

10. The structure of claim 9, wherein the gate spacer has a second decreasing gradient of carbon in the direction from the top surface of the inter-layer dielectric that is co-planar with the top surface of the etch-stop layer.

11. The structure of claim 9, wherein a first portion of the gate spacer distal from the semiconductor substrate has a greater density than a second portion of the gate spacer proximate to the semiconductor substrate.

12. The structure of claim 8 further comprising a contact through the inter-layer dielectric and the etch-stop layer to the semiconductor substrate.

13. The structure of claim 8, wherein a concentration of carbon at the co-planar surface is between $1\times10^{14}/cm^3$ and approximately $1\times10^{15}/cm^3$.

14. The structure of claim 8, wherein a first portion of the etch-stop layer distal from the semiconductor substrate has a greater density than a second portion of the etch-stop layer proximate to the semiconductor substrate.

15. A structure comprising:
   a gate stack over a semiconductor substrate;

a gate spacer along a sidewall of the gate stack, a density of a distal portion of the gate spacer distal from the semiconductor substrate being greater than a density of a proximal portion of the gate spacer proximate the semiconductor substrate, wherein the density of the distal portion of the gate spacer is substantially uniform throughout the distal portion of the gate spacer, and wherein the distal portion of the gate spacer extends from the top of the gate spacer at least to about one-third of the distance to the top of the semiconductor substrate;

an etch-stop layer over the semiconductor substrate and along a surface of the gate spacer, a density of a distal portion of the etch-stop layer distal from the semiconductor substrate being greater than a density of a proximal portion of the etch-stop layer proximate the semiconductor substrate, wherein the density of the distal portion of the etch-stop layer is substantially uniform throughout the distal portion of the etch-stop layer, and wherein the distal portion of the etch-stop layer extends from the top of the etch-stop layer at least to about one-third of the distance to the top of the semiconductor substrate;

an inter-layer dielectric over the etch-stop layer; and a contact through the inter-layer dielectric and the etch-stop layer to the semiconductor substrate.

16. The structure of claim 15, wherein a first concentration of carbon is substantially uniform throughout the distal portion of the gate spacer, a second concentration of carbon being in the proximal portion of the gate spacer and less than the first concentration of carbon, and a third concentration of carbon is substantially uniform throughout the distal portion of the etch-stop layer, a fourth concentration of carbon being in the proximal portion of the etch-stop layer and less than the third concentration of carbon.

17. The structure of claim 15, wherein a distal portion of the inter-layer dielectric distal from the semiconductor substrate is denser than a proximal portion of the inter-layer dielectric proximate the semiconductor substrate.

18. The structure of claim 15, wherein the etch-stop layer has a first decreasing gradient of carbon in a direction from the distal portion of the etch-stop layer to the proximal portion of the etch-stop layer, and the gate spacer has a second decreasing gradient of carbon in a direction from the distal portion of the gate spacer to the proximal portion of the gate spacer.

19. The structure of claim 15, wherein top surfaces of the inter-layer dielectric and the etch-stop layer form a planar surface.

20. The structure of claim 15, wherein the gate stack comprises a gate dielectric and a gate electrode, the gate dielectric extending along a sidewall of the gate electrode, the gate spacer being along a sidewall of the gate dielectric.

* * * * *